(12) United States Patent
Lee et al.

(10) Patent No.: US 7,375,415 B2
(45) Date of Patent: May 20, 2008

(54) DIE PACKAGE WITH ASYMMETRIC LEADFRAME CONNECTION

(75) Inventors: Ming Hsun Lee, Taichung (TW); Chih-Chin Liao, Changhua (TW); Cheemen Yu, Madison, WI (US); Hem Takiar, Fremont, CA (US)

(73) Assignee: SanDisk Corporation, Milpitas, CA (US)

( * ) Notice: Subject to any disclaimer, the term of this patent is extended or adjusted under 35 U.S.C. 154(b) by 108 days.

(21) Appl. No.: 11/170,897

(22) Filed: Jun. 30, 2005

(65) Prior Publication Data

US 2007/0001272 A1   Jan. 4, 2007

(51) Int. Cl.
*H01L 23/495* (2006.01)
(52) U.S. Cl. ..................... 257/666; 257/676
(58) Field of Classification Search .............. 257/723, 257/666, 676, 668
See application file for complete search history.

(56) References Cited

U.S. PATENT DOCUMENTS

| | | | |
|---|---|---|---|
| 4,934,820 A | 6/1990 | Takahashi et al. | |
| 5,373,189 A * | 12/1994 | Massit et al. | 257/686 |
| 5,780,925 A * | 7/1998 | Cipolla et al. | 257/676 |
| 6,114,750 A | 9/2000 | Udagawa et al. | |
| 6,307,257 B1 * | 10/2001 | Huang et al. | 257/676 |
| 6,605,875 B2 * | 8/2003 | Eskildsen | 257/777 |
| 6,731,011 B2 | 5/2004 | Verma et al. | |
| 6,843,421 B2 * | 1/2005 | Chhor et al. | 235/492 |
| 6,858,470 B1 | 2/2005 | Han et al. | |
| 2002/0140068 A1 | 10/2002 | Lee et al. | |
| 2004/0004272 A1 | 1/2004 | Luo et al. | |
| 2004/0089717 A1 | 5/2004 | Harari et al. | |
| 2005/0029634 A1 | 2/2005 | Ambrus | |
| 2005/0087846 A1 | 4/2005 | Han et al. | |

* cited by examiner

*Primary Examiner*—Roy Potter
(74) *Attorney, Agent, or Firm*—Vierra Magen; Marcus & DeNiro LLP (57) ABSTRACT

A leadframe for a semiconductor package is disclosed including electrical leads which extend from one side of the leadframe to an opposite side of the leadframe, where electrical connection may be made with the semiconductor die at the second side of the leadframe. The semiconductor die may be supported on the leads extending across the leadframe. The package may further include a spacer layer affixed to the electrical leads to fortify the semiconductor package and to prevent exposure of the electrical leads during the molding of the package.

30 Claims, 6 Drawing Sheets

DIE PACKAGE WITH ASYMMETRIC LEADFRAME CONNECTION

BACKGROUND OF THE INVENTION

1. Field of the Invention

Embodiments of the present invention relate to a method of a semiconductor package, and a semiconductor package formed thereby.

2. Description of the Related Art

As the size of electronic devices continue to decrease, the associated semiconductor packages that operate them are being designed with smaller form factors, lower power requirements and higher functionality. Currently, sub-micron features in semiconductor fabrication are placing higher demands on package technology including higher lead counts, reduced lead pitch, minimum footprint area and significant overall volume reduction.

Figure 1:
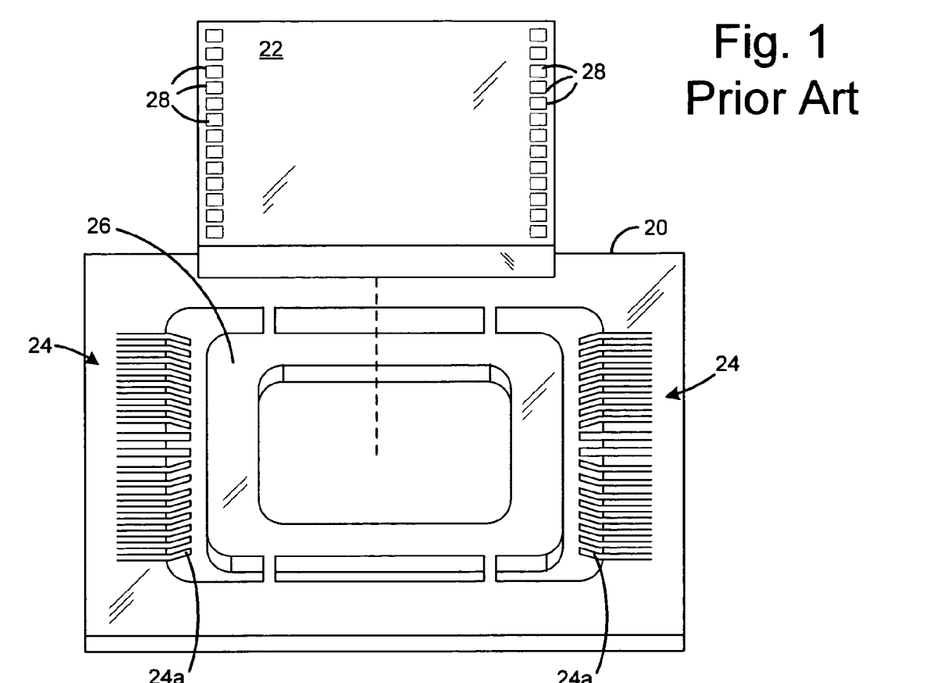
FIG. 1 is and exploded perspective view of a conventional leadframe and semiconductor die.
Figure 2:
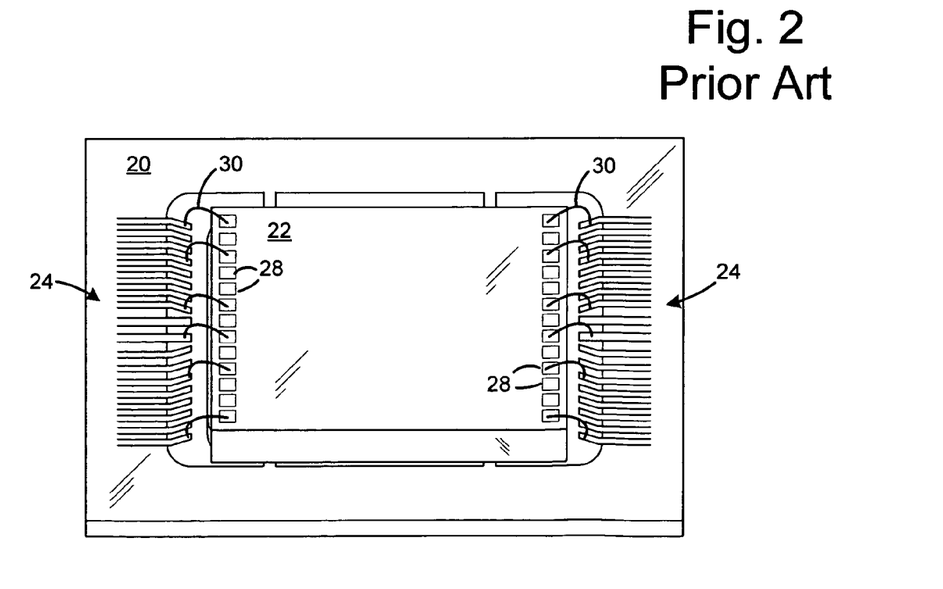
FIG. 2 is a perspective view of a conventional semiconductor die wire-bonded to a conventional leadframe.

One branch of semiconductor packaging involves the use of a leadframe, which is a thin layer of metal on which one or more semiconductor die are mounted. The leadframe includes electrical leads for communicating electrical signals from the one or more semiconductors to a printed circuit board or other external electrical devices. Common leadframe-based packages include plastic small outlined packages (PSOP), thin small outlined packages (TSOP), and shrink small outline packages (SSOP). Components in a conventional leadframe package are shown in FIGS. 1 and 2. The illustrated components may be used for example in a TSOP package, which come standard in 32-lead, 40-lead, 48-lead and 56-lead packages (fewer leads are shown in the figures for clarity).

FIG. 1 shows a leadframe 20 before attachment of a semiconductor die 22. A typical leadframe 20 may include a number of leads 24 having first ends 24a for attaching to semiconductor die 22, and a second end (not shown) for affixing to a printed circuit board or other electrical component. Leadframe 20 may further include a die attach pad 26 for structurally supporting semiconductor die 22 on leadframe 20. While die attach pad 26 may provide a path to ground, it conventionally does not carry signals to or from the semiconductor die 22. In certain leadframe configurations, it is known to omit die attach pad 26 and instead attach the semiconductor die directly to the leadframe leads in a so-called chip on lead (COL) configuration.

Semiconductor leads 24 may be mounted to die attach pad 26 as shown in FIG. 2 using a die attach compound. Semiconductor die 22 is conventionally formed with a plurality of die bond pads 28 on first and second opposed edges on the top side of the semiconductor die. Once the semiconductor die is mounted to the leadframe, a wire bond process is performed whereby bond pads 28 are electrically coupled to respective electrical leads 24 using a delicate wire 30. The assignment of a bond pad 28 to a particular electrical lead 24 is defined by industry standard specification. FIG. 2 shows less than all of the bond pads 28 being wired to leads 24 for clarity, but each bond pad may be wired to its respective electrical in conventional designs. It is also known to have less than all of the bond pads wired to an electrical as shown in FIG. 2.

Figure 3:
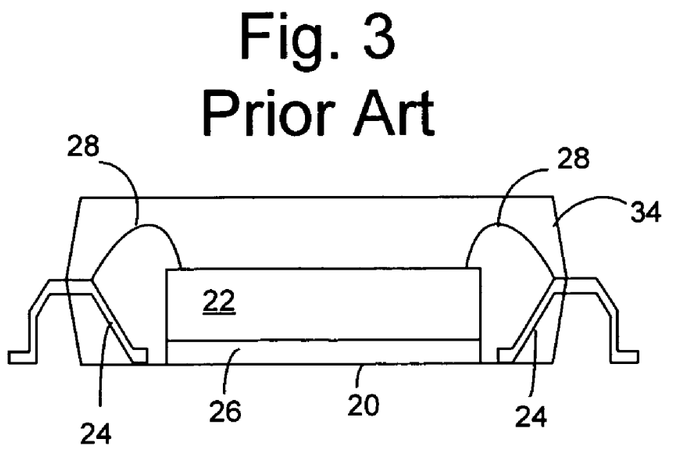
FIG. 3 is a cross-sectional side view of a conventional semiconductor package including a semiconductor die and leadframe encased in molding compound.

FIG. 3 shows a cross-sectional side view of leadframe 20 and semiconductor die 22 after the wire bond process. Once wire bonding is completed, a molding process performed to encase the components in a molding compound 34 and form the finished package. It is known to recess or "down-set" the semiconductor die within the leadframe, as shown in FIG. 3, in order to balance the semiconductor die against the forces of the molding compound as it flows around the die and leadframe. It is important that the semiconductor die be balanced during molding process as an imbalance can cause excessive movement of the semiconductor die under the force of the molding compound as it flows. Such movement can break or short one or more of the wire bonds 28, resulting in damage or complete failure of the semiconductor package. As there may be fifty or more wire bonds in a package, this can become a significant problem if the semiconductor die is not properly balanced during the molding process.

It is also know during the molding process in a down-set packaging configuration that a higher concentration of molding compound flows over the top of the semiconductor die in the molding process. This results in a downward force on top of the semiconductor die. Without the die attach pad 26 or other proper structural support, the die and leadframe may get forced downward until one or more of the electrical leads attaching to the die are exposed to the external environment at the bottom of the package. This again may result in damage or failure of the package.

Figure 4:
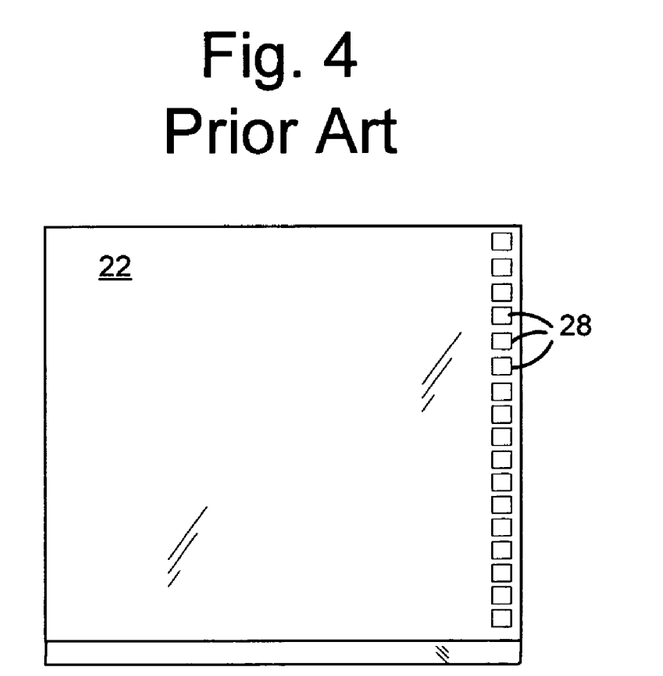
FIG. 4 is a conventional view of a semiconductor die including semiconductor bond pads along a single edge of the semiconductor die.

As shown in FIGS. 2 and 3 it is typical to have bond pads 28 on first and second opposite sides of the semiconductor die for electrical coupling with their respective leads. According to industry specification and ease of design, bond pads along the first edge of the semiconductor die connect to respective pins adjacent to first edge, and bond pads along the second edge of the semiconductor die connect to respective pins adjacent the second edge. In an effort to reduce semiconductor die form factor, it is now know to provide bond pads on a semiconductor die along only one edge of the die as shown in FIG. 4. If electrical connection is to be made to industry standard to maintain the proper pinout connections, a system is required for electrically connecting the bond pads along the single edge of the semiconductor die with the electrical leads on both the first and second sides of a leadframe.

SUMMARY OF THE INVENTION

The present invention, roughly describe relates to a method of fabricating a leadframe for a semiconductor package, and a leadframe formed thereby. The leadframe according to embodiments of the invention may be used to electrically couple die bond pads along a single edge of a semiconductor die with first and second opposed sides of the leadframe. A first side of the leadframe adjacent the bond pad edge of the die includes a plurality of electrical leads which terminate a short distance from the first side for connection to the adjacent bond pads. A second side of the leadframe opposite the first side includes a plurality of elongated electrical leads. These electrical leads extend from the second side across an interior of the leadframe and terminate proximate to the ends of the electrical leads extending from the first side of the leadframe.

One or more semiconductor die may be supported on the leadframe by being mounted to the elongated electrical leads. Thus, the elongated electrical leads serve a dual purpose of carrying electrical signals to and from the semiconductor die, as well as physically supporting the semiconductor die on the leadframe. Once the one or more semiconductor die are attached to the leadframe, the die bond pads along the single edge of the die may be wire-bonded to both the electrical leads from the first side of the leadframe and the elongated electrical leads extending from the second side of the leadframe. In embodiments, the elongated electrical leads allow the semiconductor die to be used in an industry standard pinout configuration.

After the wire-bond process, the semiconductor die, wire-bonds and portions of electrical leads may be encapsulated in molding compound to form a semiconductor die package. In a further embodiment of the present invention, before encapsulation, a spacer layer may be affixed to surfaces of the elongated electrical leads opposite the surfaces of the leads supporting the semiconductor die. The spacer layer may be a dielectric material such as for example a polyimide film or tape, or various epoxy resins. The spacer layer provides at least two benefits. First, the spacer layer fortifies and improves the balance of the leadframe during the molding process to prevent excessive movement of semiconductor die and jeopardy to the wire bond between the die and leadframe. Secondly, the spacer layer insulates and prevents exposure of the elongated electrical leads outside of the package.

DETAILED DESCRIPTION

Embodiment to the present invention will now be described in reference to FIGS. 5-10 which in general relate to a method of fabricating a semiconductor package, and a semiconductor package formed thereby. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

Figure 5:
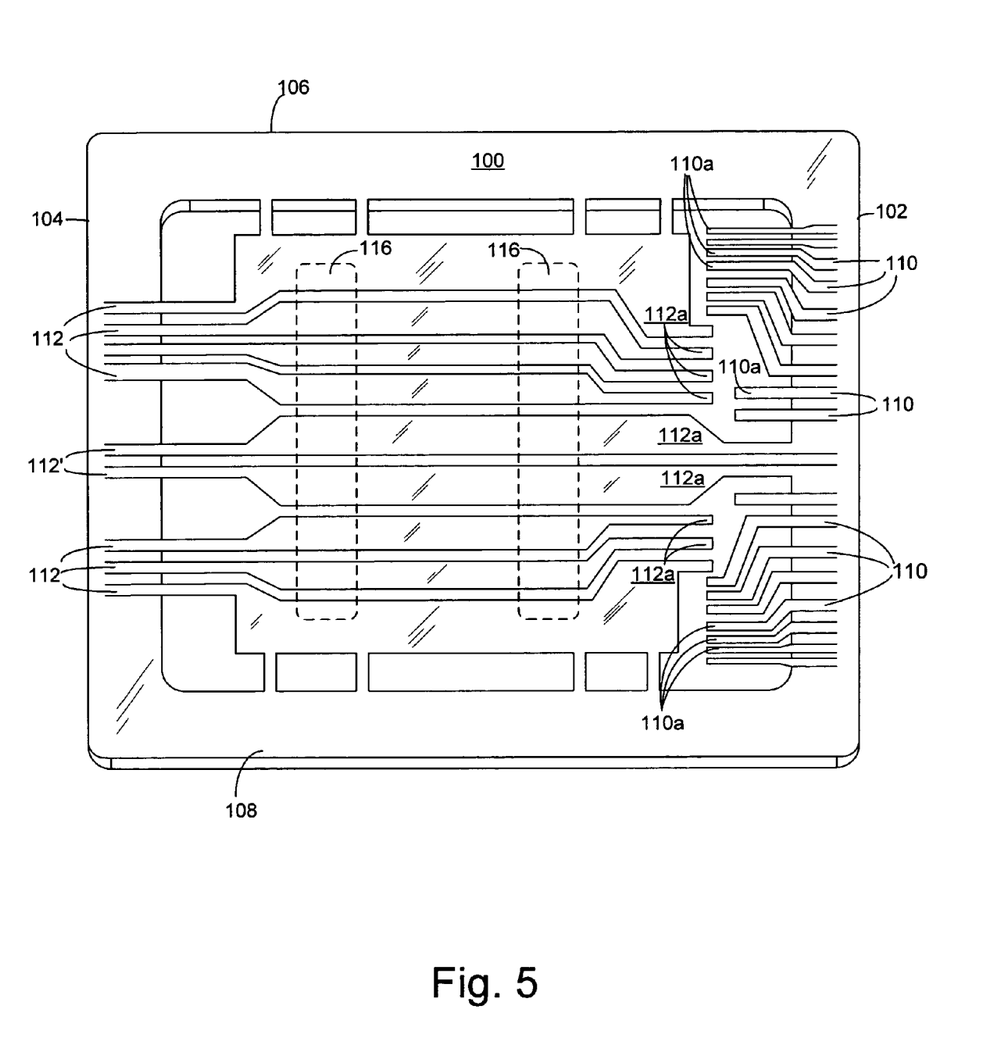
FIG. 5 is a perspective view of a leadframe according to an embodiment of the present invention.
Figure 8:
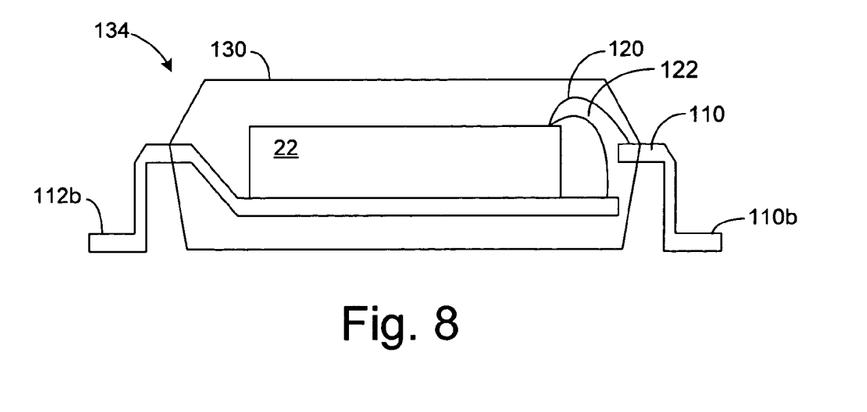
FIG. 8 is a cross-sectional side view of a semiconductor package according the present invention including a semiconductor die and leadframe encased within a molding compound.

More particularly, embodiments of the present invention relate to fabricating a leadframe for a semiconductor package having a standard pinout configuration, where the semiconductor die includes die bond pads along a single edge as shown for example by the semiconductor die of prior art FIG. 4, and the leadframe formed thereby. Referring now to FIG. 5, leadframe 100 is provided for establishing electrical connection between the semiconductor die shown for example in FIG. 4 and electrical leads on both sides of the leadframe. Leadframe 100 includes first and second opposed sides 102 and 104 and third and fourth opposed sides 106 and 108 extending generally between sides 102 and 104. Side 102 includes a plurality of electrical leads 110 having first ends 110a for connection to bond pads on a semiconductor, and second ends 110b for connection to an external device such as a printed circuit board (ends 110b are not shown in FIG. 5, but are seen in FIG. 8).

Side 104 of leadframe 100 similarly includes a plurality of electrical leads, referred to as leads 112. However, leads 112 extend from side 104 across the interior of the leadframe generally parallel to sides 106 and 108 and have ends 112a terminating proximate to ends 110a near side 102. Despite the proximity of the ends of leads 112 and 110 near side 102, leads 110 and 112 are separate and electrically isolated from each other. Leads 112 may include second ends 112b opposite ends 112a for connection to an external device such as a printed circuit board (ends 112b are not shown in FIG. 5, but are seen in FIG. 8). In embodiments, the leadframe 100 may be formed of copper, copper alloy or any of a variety of conductive materials from which leadframes are made.

One or more of the leads 112 may extend between and be attached to both sides 102 and 104 of leadframe 100, such as for example the leads indicated at 112'. Leads 112' connected to both sides 102 and 104 do not carry electrical signals from the semiconductor die, but may be used for an electrical ground for the semiconductor die, as well as providing structural support for the semiconductor die mounted thereon as explained hereinafter. With the exception of leads 112' attached to both sides, leads 112 may in general be thought of collectively as a cantilever extending from side 104 of leadframe 100. There may be no leads 112' that connect to both sides 102 and 104 in alternative embodiments of the present invention.

It is understood that the configuration of the various leads 112 and 110 shown in the figures is one possible configuration of many. Those of skill in the art would appreciate a wide variety of configurations including short leads 110 and long leads 112 extending beneath the semiconductor die. While the long cantilevered electrical leads 112 have been described as coming from side 104 and extending towards side 102, it is understood that the respective positions of leads 110 and 112 may be reversed to operate with semiconductor die having wire bond pads along an edge opposite to that shown in the figures.

In an embodiment of the invention, each of the electrical leads 112 may be affixed together by reinforcements 116 extending generally transverse to and across each of the electrical leads 112. Reinforcements 116 may be any of various dielectric materials having a degree of rigidity to thereby hold electrical lead 112 together in order to improve the structural support of electrical leads 112 as a whole. In one embodiment, reinforcements may be a polyimide adhesive tape affixed across the top and/or bottom surface of electrical leads 112. In an embodiment, electrical leads may be formed with a pair of grooves for receiving the polyimide tape. In alternative embodiments, reinforcements 116 may be formed of other isolative materials, including epoxy resins (FR-4, FR-5) or bismaleimide triazine (BT), provided in the notches and adhered to electrical leads 112. In alternative embodiments of the invention, more or less than two reinforcements 116 may be provided on fingers 112. In further embodiments, reinforcements 116 may be omitted entirely.

Figure 6:
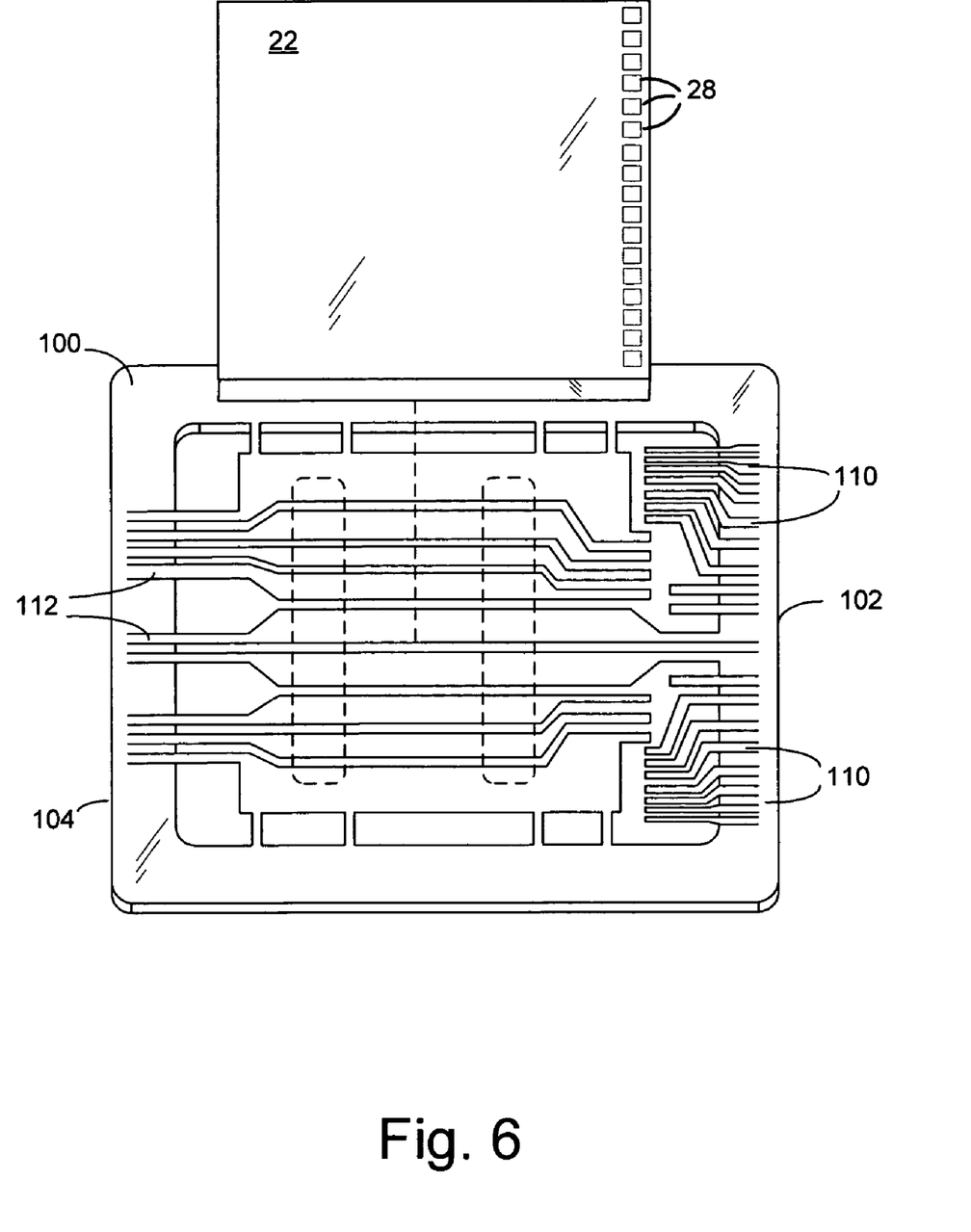
FIG. 6 is an exploded perspective view of a leadframe according the embodiment of the present invention and a semiconductor die having bond pads along a single edge.

FIG. 6 shows an exploded perspective view of a conventional semiconductor die 22 to be mounted on leadframe 100. As indicated above, semiconductor die 22 may include a plurality of die bond pads 28 down a side of semiconductor die lying adjacent leadframe side 102 when the die is attached. It is understood that semiconductor 22 may include die bond pads at other locations of the semiconductor die. However, the leadframe 100 according to the present invention may be used any time it is desired to electrically couple die bond pads along a single edge of a semiconductor die with first and second opposed sides of the leadframe. It is contemplated that leadframe 100 may include additional leads on side 104 for connecting with die bond pads on semiconductor die 22 in the event that semiconductor die 22 has die bond pads on first and second opposed sides.

Semiconductor die 22 may be bonded to fingers 112 of leadframe 100 using a dielectric die-attached compound. Thus, electrical leads 112 serve a dual purpose of carrying electrical signals to and from semiconductor die 22, as well as physically supporting semiconductor 22 on leadframe 100. Due to the fact that leads 112 carry electrical signals, semiconductor die 22 should be attached to leads 112 using an electrically insulative die bond compound. In embodiments, it is contemplated that a dielectric film or a layer be applied between semiconductor die 22 and leads 112 in addition to the die attach compound.

While the leads 112 extend beneath die 22 in embodiments of the invention, it is contemplated that the leads 112 may extend over the die 22 in alternative embodiments to make connection with the die bond pads along the single edge of the die 22. In such embodiments, the die may be supported in the leadframe by a die attach pad, spacer layer (described hereinafter) or other supporting member.

Figure 7:
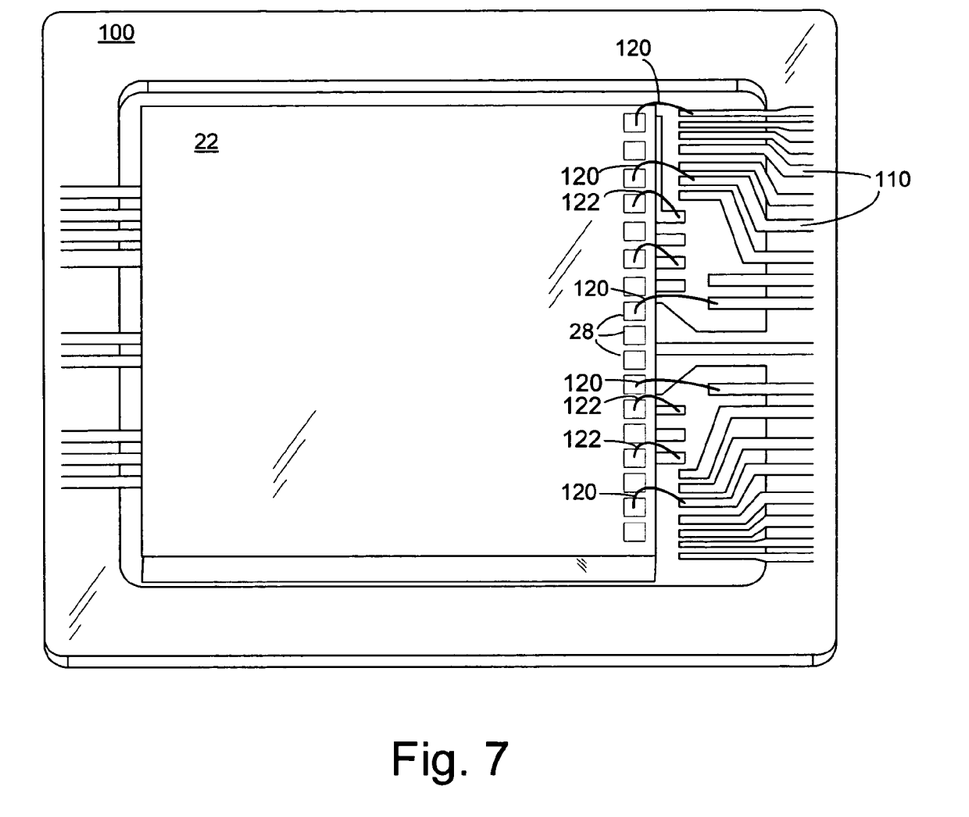
FIG. 7 is a perspective view of a semiconductor die wire-bonded to a leadframe according to an embodiment of the present invention.

FIG. 7 shows die 22 affixed to leads 112 in leadframe 100. Once die 22 is attached, the die bond pads 28 may be wire-bonded to the respective electrical leads 110 and 112 in a known wire-bond process. As dictated by industry standard or customized specification, some of the wire bond pads 28 may be electrically coupled to electrical leads 110, as shown for example by wire bonds 120 and other die bond pads 28 may be electrically coupled to electrical leads 112 as shown by wire bonds 122. In embodiments, some of the die bond pads 28 may remain unconnected to either leads 110 or 112. Alternatively, embodiments, each of the die bonds pads 28 may be wire-bonded to one of the electrical leads 110, 112. In embodiments, the leads 112 of leadframe 100 allow the semiconductor die 22 to be used in an industry standard pinout configuration.

FIG. 8 is a cross-sectional side view of a semiconductor die 22 mounted on electrical leads 112 and wire-bonded to electrical leads 110 and 112 as described above. In embodiments, electrical leads 112 may be angled so as to provide a downset configuration. After the wire-bond process as described above, semiconductor 22, wire-bonds 120, 122 and portions of leads 110 and 112 may be encapsulated in molding compound 130 in a known process to form a semiconductor die package 134. Although not required, leadframe 100 according to the above-described embodiments may maintain the same pinout assignments as for a semiconductor die having die pads along two edges. Once fabrication of semiconductor die package 134 is completed and the package is tested, the package 134 may then be surface-mounted to an electrical component such as a printed circuit board in a known surface mount process.

As discussed in the Background of the Invention section, the mold compound flow exerts forces on the semiconductor die during the molding process which can cause excessive movement of the semiconductor die if the semiconductor die is not properly balanced or supported on a leadframe. If not properly balanced or supported, one or more of the wire bonds may break or short. Moreover, a lower surface of the leadframe may be forced downward and exposed through the bottom of the completed package. Exposure of the leads 112 may be problematic in a package according to the present invention in that leads 112 carry signals from the semiconductor die.

Figure 9:
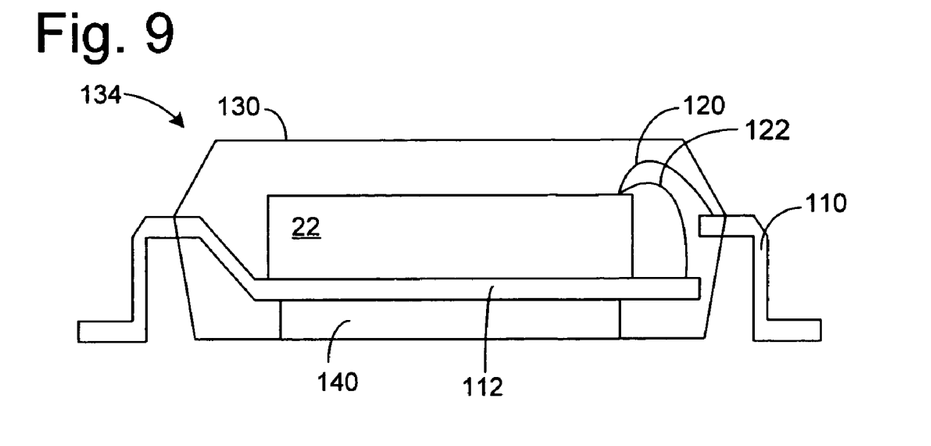
FIG. 9 is a cross-sectional side view of a semiconductor die according to an alternative embodiment of the present invention including a semiconductor die, leadframe and spacer layer encased within a molding compound.

Therefore, in accordance with a further embodiment of the present invention shown in FIG. 9, a spacer layer 140 may be affixed to generally horizontal surfaces of electrical leads 112 on a side of electrical leads 112 opposite semiconductor die 22. In embodiments, spacer layer 140 may be a dielectric material such as for example a polyimide film or tape, or epoxy resins (FR-4, FR-5) or bismaleimide triazine (BT), affixed to electrical leads 112 by known adhesive compound. The thickness of spacer layer 140 may vary depending upon the space requirements within package 134.

After the molding process and any finishing required for package 134, the spacer layer may be completely encapsulated within the package 134, or a bottom surface of spacer layer may be exposed to the environment outside of package 134 without consequence to the operation of package 134. Spacer layer 140 provides at least two benefits. First, the spacer layer 140 fortifies and increases the structural support and balance of the leadframe during the molding process to prevent excessive movement of semiconductor die and jeopardy to the wire bond between the die and leadframe. Secondly, spacer layer 140 insulates and prevents exposure of electrical leads 112 outside of the package. While spacer layer 140 is formed of a dielectric material an embodiment to the invention, it may alternatively be formed of a semi-conductive material such as for example silicon, or a conductive material, and be affixed to electrical leads 112 via a dielectric die attach compound.

In the embodiment described above, the spacer layer is helpful in steadying the cantilevered electrical leads 112 during the molding process to prevent damage to the wire bonds and exposure of the leads 112. However, it is understood that the spacer layer 140 may also be advantageously used for the same purpose in an otherwise conventional leadframe die package. That is, the spacer layer may be used in a leadframe configuration where the semiconductor die has bond pads along two edges of the die, and the leadframe includes conventional electrical leads. In such embodiments, the semiconductor die may attach directly to the leadframe in a chip on lead (COL) configuration, or the spacer layer may be used in addition to a die attach pad.

Embodiments of the present invention described thus far have included a single semiconductor die 22. It is understood that more than one semiconductor die may be included in package 134 in alternative embodiments of the present invention. The embodiment shown in FIG. 10 includes three semiconductor die 22a, 22b, and 22c. It is understood that two or more than three semiconductor die may be used in alternative embodiments of the present invention. Each of the die may include die bond pads along the single edge, and may be offset as shown so that all three semiconductor die may be bonded off of a single edge to both electrical leads 110 and 112 as described above and as shown by the wire bond 120, 122 in FIG. 10. The single semiconductor die of FIGS. 8 and 9 and the multiple semiconductor die embodiment of FIG. 10 may preferably operate using spacer layer 140. However, it is understood that the embodiments of FIGS. 8 and 10 may operate without spacer layer 140.

Figure 10:
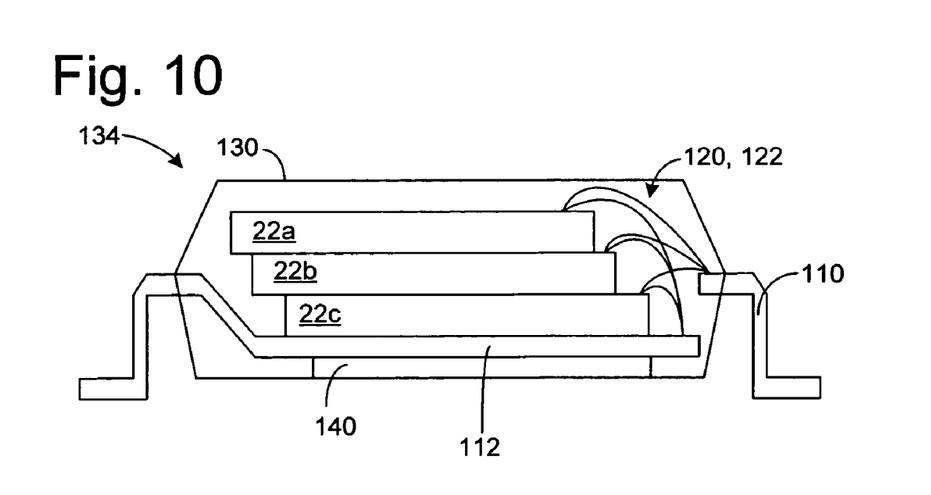
FIG. 10 is a cross-sectional side view of a semiconductor package according to a further embodiment of the present invention including a plurality of semiconductor die.

In the embodiment of FIG. 10, each of the semiconductor die 22a, 22b, and 22c have die bond pads along a single common edge. In a further embodiment, at least on the die may include die bond pads along a single edge and at least one other of the die have wire-bond pads along two opposite edges. In such an embodiment, semiconductor package 134 may include electrical leads 110 and 112 adjacent the first edge of the semiconductor die as shown in FIG. 10. The package 134 may further include additional electrical leads (not shown) extending from side 104 on leadframe 100 adjacent the second, opposite edge of the semiconductor die. These additional electrical leads may electrically couple to die bond pads along that edge.

In a still further embodiment, it is contemplated that a first semiconductor die include die bond pads along only a first edge, and a second semiconductor die include die bond pads only along a second edge opposite the first edge. For such an embodiment, it is contemplated that the first side of the leadframe include both short electrical leads (as in leads 110) and long electrical leads extending beneath the semiconductor die (as in leads 112). The second side of the leadframe similarly includes short electrical leads and long electrical leads extending beneath the semiconductor die. In such embodiments, the semiconductor die may be physically attached to both sets of long electrical leads, and the long electrical leads may be interwoven with each other without contacting each other. Thus, the leadframe 100 in such an embodiment would be capable of connecting die bond pads along a first edge of a die to leads on both sides of the leadframe, and the leadframe 100 would be capable of connecting die bond pads along a second, opposite edge of a die to leads on both sides of the leadframe.

The above-described semiconductor die and leadframe may be used to form a TSOP 48-pin configuration. It is understood however that the number of pins and the type of leadframe package may vary significantly in alternative embodiments of the present invention. Although the type of die used is not critical to the present invention, the semiconductor die used in package 134 may be flash memory chips (NOR/NAND), SRAM or DDT, and/or a controller chip such as an ASIC. Other integrated circuit die for performing other functions are contemplated.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A leadframe for use in a semiconductor package, the leadframe including first and second opposed sides, a semiconductor die capable of fitting on the leadframe between the first and second sides, the semiconductor die having bond pads along a first edge of the semiconductor die, the leadframe comprising:
   one or more electrical leads for connecting one or more of the die bond pads to one or more external connections on the first side of the leadframe when the semiconductor die is connected to a first substantially horizontal surface of the leadframe, the one or more die bond pads positioned adjacent the second side of the leadframe when the semiconductor die is connected to the leadframe; and
   a spacer layer mounted on a second substantially horizontal surface of the leadframe opposite the first substantially horizontal surface, the spacer layer fortifying the leadframe during a molding process for the semiconductor package.

2. A leadframe as recited in claim 1 the one or more electrical leads extending from the first side of the leadframe and terminating adjacent the second side of the leadframe.

3. A leadframe as recited in claim 2, the one or more electrical leads extending from the first side of the lead frame additionally provided for supporting the semiconductor die.

4. A leadframe as recited in claim 3, the semiconductor die having a first edge lying adjacent the first side of the leadframe when the semiconductor die is supported on the leadframe, and the semiconductor die having a second edge lying adjacent the second side of the leadframe when the semiconductor die is supported on the leadframe, the one or more electrical leads extending from the first side of the leadframe a distance so as to protrude from beneath the second edge of the semiconductor die when the one or more semiconductor die are supported thereon.

5. A leadframe for use in a semiconductor package, the leadframe including first and second opposed sides, one or more semiconductor die capable of fitting on the lead frame between the first and second sides, the one or more semiconductor die having a first edge lying adjacent the first side of the the leadframe when the one or more semiconductor die are supported on the leadframe, and the one or more semiconductor die having a second edge lying adjacent the second side of the leadframe when the one or more semiconductor die are supported on the leadframe, the leadframe comprising:
   a first group of electrical leads extending from the first side of the leadframe, the first group of electrical leads terminating near the second side of the leadframe, the first group of electrical leads capable of supporting the one or more semiconductor die, and the first group of electrical leads provided for electrical connection to die bond pads along the second edge of the one or more semiconductor die; and
   reinforcements extending generally transverse to and across the first group of electrical leads, the reinforcements increasing a structural support of the first group of electrical leads.

6. A leadframe as recited in claim 5, further comprising a second group of electrical leads extending from the second side of the leadframe, the second group of electrical leads provided for connecting to the die bond pads along the second edge of the one or more semiconductor die.

7. A leadframe as recited in claim 6, the second group of electrical leads extending from the second side of the leadframe and terminating near the second side of the leadframe, proximate to ends of the first group of electrical leads extending from the first side.

8. A leadframe for use in a semiconductor package including one or more semiconductor die, the leadframe comprising:
a plurality of electrical leads, the one or more semiconductor die mounting to at least a portion of the plurality of electrical leads on a first substantially horizontal side of the plurality of electrical leads; and
a spacer layer mounted on a second substantially horizontal side of the electrical leads opposite the first substantially horizontal side, the spacer layer fortifying the leadframe during a molding process for the semiconductor package.

9. A leadframe as recited in claim 8, the leadframe further comprising:
first and second opposed edges, the one or more semiconductor die capable of fitting on the lead frame between the first and second sides; and
one or more electrical leads of the plurality of electrical leads extending from the first side of the leadframe, the one or more electrical leads terminating near the second side of the leadframe.

10. A leadframe as recited in claim 8, the spacer layer being formed of a dielectric material.

11. A semiconductor package, comprising:
a semiconductor die having first and second opposed edges;
a leadframe for supporting the semiconductor die, the leadframe including:
first and second opposed sides, the first side being adjacent the first edge of the semiconductor die, and the second side being adjacent the second edge of the semiconductor die,
a first group of electrical leads having first ends connected from the first side of the leadframe to electrical connections external to the package, and having second ends opposite the first ends connected to the semiconductor die at the first edge of the semiconductor die, and
a second group of electrical leads having first ends connected from the second side of the leadframe to electrical connections external to the package, and having second ends opposite the first ends connected to the semiconductor die at the first edge of the semiconductor die; and
a spacer layer mounted within the package below the second group of electrical leads, the spacer layer providing support to the leadframe.

12. A semiconductor package as recited in claim 11, the second group of electrical leads extending from the second side of the leadframe and terminating near the first edge of the semiconductor die.

13. A semiconductor package as recited in claim 11, wherein the semiconductor die is mounted to the second group of electrical leads.

14. A semiconductor package as recited in claim 13, wherein the second ends of the second group of electrical leads extend out past the first edge of the semiconductor die.

15. A semiconductor package as recited in claim 11, further comprising a first group of one or more wire bonds at the first edge of the semiconductor die, between the semiconductor die and the second group of electrical leads.

16. A semiconductor package as recited in claim 15, further comprising a second group of one or more wire bonds at the first edge of the semiconductor die, between the semiconductor die and the first group of electrical leads.

17. A semiconductor package as recited in claim 11, the semiconductor package being a flash memory package.

18. A semiconductor package, comprising:
a semiconductor die having first and second opposed edges;
a leadframe for supporting the semiconductor die, the leadframe including:
first and second opposed sides, the first side being adjacent the first edge of the semiconductor die, and the second side being adjacent the second edge of the semiconductor die,
a first group of electrical leads having first ends connected from the first side of the leadframe to electrical connections external to the package, and having second ends opposite the first ends connected to the semiconductor die at the first edge of the semiconductor die, and
a second group of electrical leads having first ends connected from the second side of the leadframe to electrical connections external to the package, and having second ends opposite the first ends connected to the semiconductor die at the first edge of the semiconductor die; and
reinforcements extending generally transverse to and across the first group of electrical leads, the reinforcements increasing a structural support of the first group of electrical leads.

19. A semiconductor package as recited in claim 18, the second group of electrical leads extending from the second side of the leadframe and terminating near the first edge of the semiconductor die.

20. A semiconductor package as recited in claim 18, wherein the semiconductor die is mounted to the second group of electrical leads.

21. A semiconductor package as recited in claim 20, wherein the second ends of the second group of electrical leads extend out past the first edge of the semiconductor die.

22. A semiconductor package as recited in claim 18, further comprising a first group of one or more wire bonds at the first edge of the semiconductor die, between the semiconductor die and the second group of electrical leads.

23. A semiconductor package as recited in claim 22, further comprising a second group of one or more wire bonds at the first edge of the semiconductor die, between the semiconductor die and the first group of electrical leads.

24. A semiconductor package as recited in claim 11, the semiconductor package being a flash memory package.

25. A semiconductor package as recited in claim 18, wherein the reinforcements are formed of a dielectric material.

26. A semiconductor package as recited in claim 25, wherein the dielectric material is one of polyimide adhesive tape, epoxy resins including FR-4, FR-5, and bismaleimide triazine.

27. A semiconductor package as recited in claim 18, wherein the first group of electrical leads include notches for receiving the reinforcements.

28. A leadframe as recited in claim 5, wherein the reinforcements are formed of a dielectric material.

29. A leadframe as recited in claim 28, wherein the dielectric material is one of polyimide adhesive tape, epoxy resins including FR-4, FR-5, and bismaleimide triazine.

30. A leadframe as recited in claim 5, wherein the first group of electrical leads include notches for receiving the reinforcements.

* * * * *